(12) United States Patent
Noguchi et al.

(10) Patent No.: US 6,465,049 B2
(45) Date of Patent: Oct. 15, 2002

(54) METHOD FOR PREPARATION OF DIAMOND FILM

(75) Inventors: Hitoshi Noguchi, Gunma-ken (JP); Yoshihiro Kubota, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/741,431

(22) Filed: Dec. 21, 2000

(65) Prior Publication Data

US 2001/0033899 A1 Oct. 25, 2001

(30) Foreign Application Priority Data

Dec. 24, 1999 (JP) .......................................... 11-366608

(51) Int. Cl.⁷ ................................................. B05D 1/22

(52) U.S. Cl. ........................ 427/459; 427/460; 427/461

(58) Field of Search ................................. 427/459, 460, 427/461, 185; 118/634

(56) References Cited

U.S. PATENT DOCUMENTS 4,084,018 A * 4/1978 Karr
4,689,241 A * 8/1987 Richart et al.
5,567,468 A * 10/1996 Lucas \* cited by examiner

*Primary Examiner*—Fred J. Parker
(74) *Attorney, Agent, or Firm*—Wenderoth, Lind & Ponack, L.L.P.

(57) ABSTRACT

In subjecting a substrate of low electric conductivity to a pretreatment by holding the same within a fluidized bed of diamond particles for the formation of a diamond film on the substrate surface, a treatment method is disclosed which is capable of preventing decrease in the effect of the pretreatment. The pretreatment of the substrate is conducted within a fluidized bed of diamond particles by keeping the electrostatic potential of the substrate in the range from −1.5 to +1.5 kV. It is desirable that the relative humidity of the gas for the fluidization of diamond particles is controlled to be 40% or higher. It is more desirable that ion bombardment onto the substrate surface to effect neutralization of the electrostatic charges. The fluidizing gas is humidified preferably by using a bubbling apparatus or spraying apparatus.

7 Claims, 2 Drawing Sheets

METHOD FOR PREPARATION OF DIAMOND FILM

BACKGROUND OF THE INVENTION

The present invention relates to a method for the preparation of a diamond film or, more particularly, to a method for the preparation of a diamond film for lithography.

By utilizing the unique characteristics possessed by diamond, laminated bodies with a diamond film formed on a substrate are widely employed as a material of a photomask for patterning light-exposure in the lithographic technology used in the manufacture of semiconductor devices or as a grinding and polishing tool.

Attempts are made for the formation of a diamond film on a substrate by the method of vapor-phase synthesis. In order to form and grow a vapor-phase synthesized diamond film on a substrate, it is desirable that the substrate is provided in advance with particulate bodies to serve as the nuclei for the growth of the diamond film or with scratches to serve as the sites for the incipient nucleus formation.

As an efficient method for the advance formation of nuclei or scratches for the growth of a diamond film on the substrate, one of the inventors previously proposed a method of so-called fluidized-bed pretreatment in which a pretreatment of the substrate is conducted by holding the substrate within a bed of diamond particles under fluidization by means of an ascending gas flow at a velocity not lower than the fluidization-initiating velocity of the particles (see Japanese Patent Kokai 9-260251).

This method is characterized in that a semiconductor silicon wafer, which is advantageous with regard to semiconductor processes, is employed as the substrate so as to be adaptable to the preparation of a lithographic mask membrane and that the velocity of gas flow for fluidization of the diamond particles is at least five times of the fluidization-initiating velocity.

In this fluidized-bed pretreatment method, however, diamond particles as an insulating material having a volume resistivity of $10^{12}$ ohm·cm or higher are brought into fluidization by using a fluidizing gas, which is dry nitrogen gas in many cases, so that the diamond particles are readily charged electrostatically. When the substrate to be subjected to the fluidized-bed treatment is made of a material of low electric conductivity, a sufficient effect of the pretreatment cannot be obtained because the surface of the substrate per se is electrostatically charged by the deposition of the charged diamond particles which inhibit impingement of further diamond particles at the substrate surface. This phenomenon results in a disadvantage of local decrease in the effect of the pretreatment to give a non-uniform film due to local inhibition of growth of the diamond film in the course of formation and growth of the diamond film.

In view of the above described problems, the present invention has an object to provide a method for the fluidized-bed pretreatment capable of effectively preventing a decrease in the effect of pretreatment due to the phenomenon of electrostatic charging when a substrate material of low electric conductivity is subjected to a pretreatment by holding within a fluidized bed of diamond particles for the formation of a diamond film on the surface thereof.

SUMMARY OF THE INVENTION

In order to accomplish the above mentioned object, the method of the present invention for the preparation of a diamond film is characterized in that, when the pretreatment of a substrate is conducted within a fluidized bed of diamond particles for the formation of a film consisting of vapor-phase synthesized diamond, the potential of the substrate due to electrostatic charging is kept in a range from −1.5 to +1.5 kV. It is desirable in order to keep the electrostatic potential of the substrate in the above mentioned range that the relative humidity of the fluidizing gas for the diamond particles is controlled at 40% or higher. It is more desirable that the electrostatic charges are neutralized by undertaking ion bombardment at the substrate surface. Further, it is preferable in order to control the relative humidity of the fluidizing gas for the diamond particles that a dry fluidizing gas is humidified by bubbling into water or by spraying of water.

DETAILED DESCRIPTION OF THE PREFERRED EMBODIMENTS

In the following, embodiments of the present invention are described in detail.

The substrate materials for the formation of a diamond film to be used here include, when the laminate obtained is employed as a mask material for patterning exposure in the X-ray or electron beam lithography, semiconductor silicon wafers or high-resistivity silicon wafers having an advantage with regard to semiconductor processes, substrates consisting of silicon carbide or silicon nitride and substrates by the formation of a coating film of silicon carbide or silicon nitride on a silicon wafer as well as laminates as a combination of several of them. With regard to the diameter of the substrate, substrates having about the same diameter as the wafers conventionally used in the manufacture of semiconductor devices or, for example, a diameter of 4 to 8 inches are employed.

When to be used as a grinding or polishing tool, a base body of the tool made of a metallic material or ceramic material in the form of a needle, plate, drum and the like can be employed.

In the following, description is given mainly for the formation of a diamond film which is intended for the use as a material of exposure mask used in X-ray or electron beam lithography but the present invention is never limited thereby.

Along with the upgrading trend relative to the accuracy and degree of integration required for semiconductor devices in recent years, increase of fineness is required also for the patterns formed on a substrate and, as a technology capable of complying with this requirement, the lithographic patterning technology by utilizing X-rays or electron beams is now highlighted.

Figure 1:
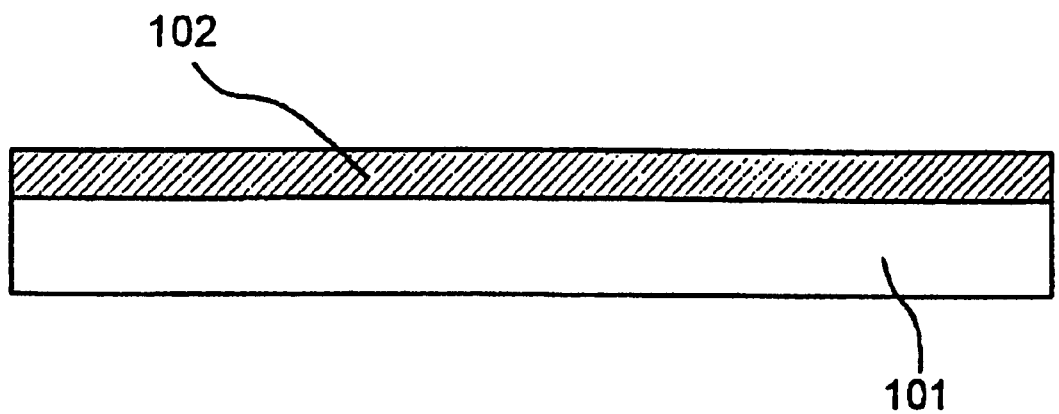
FIG. 1 is a schematic cross sectional view of a mask substrate for X-ray and electron-beam lithography.

Exposure machines are employed in many cases for the formation of such a fine pattern. The exposure mask material mounted on the exposure machine has a cross sectional structure illustrated, for example, in FIG. 1. In FIG. 1, the exposure mask material for lithography is constituted of a substrate 101 and an X-ray or electron beam transmitting film 102 by film formation thereon. The transmitting film 102 may serve as a scattering film and is called an absorbersupporting film or a scattering body-supporting film depending on the intended application. They are generally called a mask membrane in the present invention.

A mask membrane here is required to have following properties including:
(1) high mechanical strengths;
(2) resistance to withstand irradiation of high-energy beams such as high-energy electron beams and synchrotron radiation; and
(3) high transmissivity to visible light in order to facilitate high-precision alignment.

The mask membrane materials proposed to satisfy these characteristics include diamond, silicon nitride, silicon carbide, silicon and the like but, among these materials, diamond is taken to be the most suitable as a mask material for X-ray or electron beam lithography in respects of the high Young's modulus as well as excellent resistance against chemicals and resistance against high-energy irradiation.

In the present invention, the coating film to be film-formed in the following is limited to a diamond film because of this reason.

Thus, when a diamond film is formed and grown by utilizing the vapor-phase synthesis method on the surface of a wafer-formed substrate or a base body of tools, it is desirable that the substrate surface is provided with nuclei of diamond or scratches to serve as the sites for the generation of nuclei are formed on the substrate surface. In order to form nuclei of diamond or scratches on the substrate surface, the substrate is held within a fluidized bed of diamond particles to cause impingement of the diamond particles under fluidization at the substrate surface resulting in the formation of scratches to serve as the center for nucleus generation of diamond or deposition of diamond particles.

The diamond particles used for the fluidized-bed pretreatment of a substrate can be either synthetic diamond or natural diamond and the particle diameter thereof is preferably in the range from 0.1 to 700 $\mu$m. A particle diameter deviating from this range may cause a difficulty in fluidization.

It takes place very easily that, when diamond particles are brought into fluidization with a gas stream of dry nitrogen and the like, diamond particles are electrostatically charged since diamond particles are insulator particles. When a substrate of low electric conductivity is subjected to the fluidized-bed pretreatment, impingement or deposition of the diamond particles at or onto the substrate surface results in inhibition of further impingement of diamond particles at the substrate surface so that no sufficient effect of pretreatment can be obtained.

When a substrate of silicon carbide (volume resistivity $\rho_{SiC}=8\times10^3$ ohm·cm) was used as the substrate, for example, and diamond particles were brought into fluidization with dry nitrogen, it was the case that the silicon carbide substrate was electrostatically charged to have a potential of −2.6 kV.

As the essential scope of the present invention, it is necessary in order to prevent such electrostatic charging that the substrate under the fluidized-bed pretreatment is kept at a potential in a range from −1.5 kV to +1.5 kV with the absolute value thereof as low as possible. When the potential is outside of this range, the energy of collision of the positively or negatively charged diamond particles are so decreased that no sufficient effect of the pretreatment can be obtained.

A measure for keeping the potential of the substrate in the range from −1.5 kV to +1.5 kV is to keep the diamond particles from electrostatic charging. It is desirable therefor that the relative humidity of the fluidizing gas is controlled to be at least 40% or, preferably, at least 50%.

The length of time required for the fluidized-bed pretreatment is from 3 hours to 5 hours. When the treatment time is shorter than 3 hours, no sufficient effect of the treatment can be obtained while no further increased effect of the treatment can be expected even in excess over 5 hours.

The gas for the formation of the fluidized bed is required to have no reactivity with the substrate at the treatment temperature and nitrogen, argon and the like can usually be used. The flow velocity of the fluidizing gas is preferably at least 5 times of the velocity for incipient fluidization and, when diamond particles of 400 $\mu$m particle diameter are fluidized with nitrogen gas, should be at least 91.5 cm/second.

Dry nitrogen gas of the relative humidity of approximately 0% with good industrial availability can be used as the fluidizing gas. Control of the relative humidity within the above mentioned range is accomplished when the same is humidified by passing through a bubbling unit holding pure water or by using a spraying unit equipped with an ultrasonic oscillator.

If necessary, an ionizer of the in-line type is employed to concurrently conduction bombardment so that the effect of electrostatic charge prevention on the substrate surface can further be enhanced.

As the vapor-phase synthetic film forming method of diamond in which a film of diamond is formed and grown on the substrate after the fluidized-bed pretreatment, applicable methods include the DC arc discharge method, DC glow discharge method, combustion flame method, high-frequency (13.56 MHz) vapor-phase synthetic method, microwave (2.45 GHz) vapor-phase synthetic method, hot filament method, and others are applicable, of which the microwave vapor-phase synthetic method is the most preferable because intermixing of impurities does not caused as a consequence of the electrodeless discharging and film forming can be performed over a long time with good reproducibility and stability. The diamond film thus obtained has a thickness of 0.1 to 3.0 $\mu$m.

Figure 2:
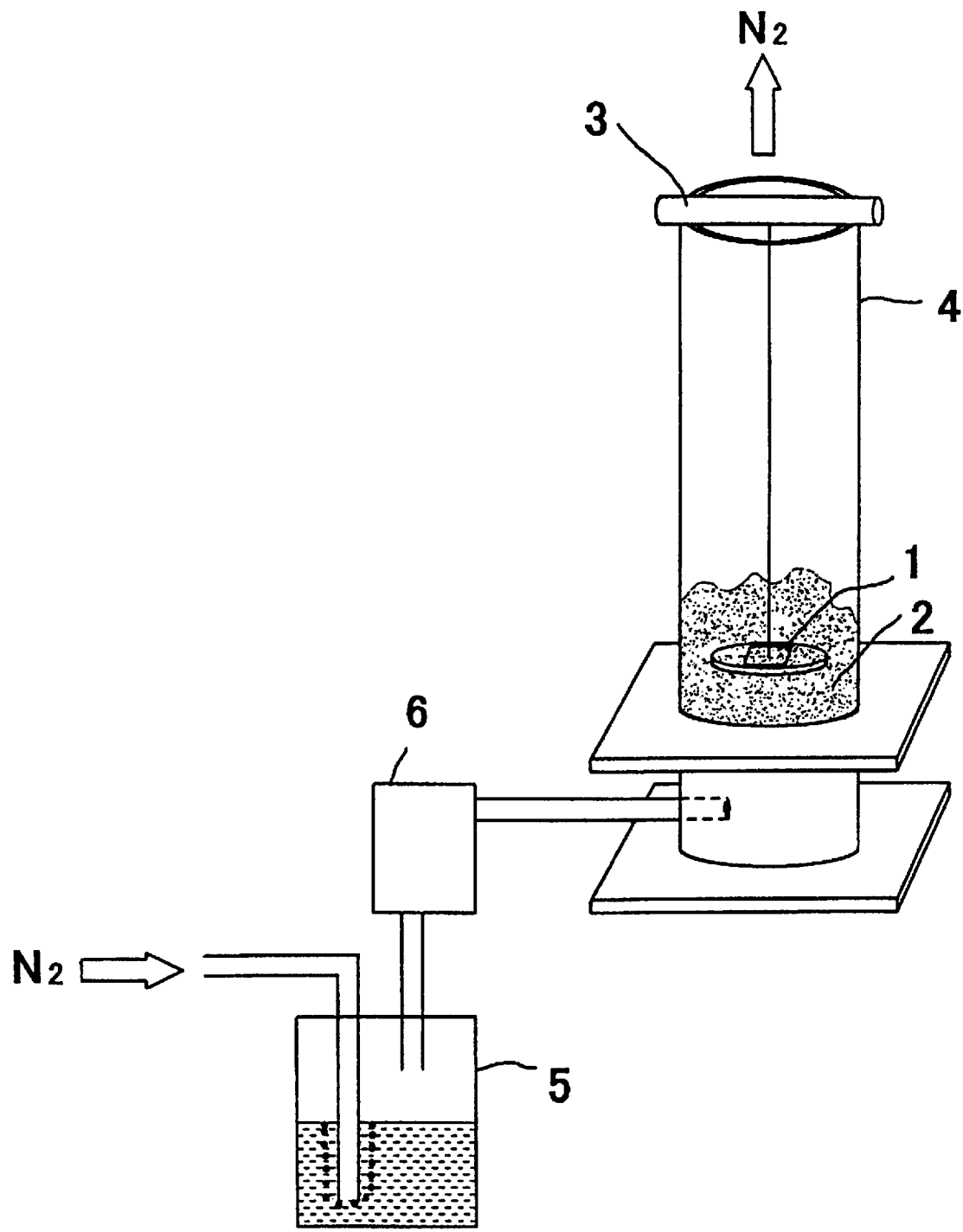
FIG. 2 is a schematic illustration of an apparatus for conducting pretreatment of a substrate according to the present invention.

The fluidized-bed pretreatment of a substrate within a fluidized bed of diamond particles is conducted, for example, by using an apparatus as illustrated in FIG. 2. FIG. 2 shows a schematic illustration of an apparatus for conducting the fluidized-bed pretreatment of a substrate according to the present invention and, in FIG. 2, the substrate 1 for the treatment or, for example, a wafer-formed substrate 1 for the preparation of an exposure mask material for the X-ray or electron beam lithography is held within a fluidized bed of diamond particles formed in the treatment vessel 4 by hanging from a supporting member 3. Nitrogen gas after humidification through a bubbler 5 containing pure water is introduced into the treatment vessel 4 at the bottom to form a fluidized bed 2 and discharged out of the upper part of the treatment vessel 4. If necessary, an ionizer 6 is installed in the course of the introduction passage of the nitrogen gas to ionize the humidified nitrogen gas.

In the following Examples and Comparative Examples are given but the present invention is never limited thereby.

EXAMPLE 1

The substrate used was a surface-coated wafer which was a silicon wafer having a diameter of 4 inches and a thickness of 0.625 mm (crystalline plane orientation (100), resistivity $\rho_{Si}=1$ ohm·cm) polished on both surfaces and provided on both surfaces with a 0.5 $\mu$m thick coating film of silicon nitride (resistivity $\rho_{SiN}>10^{13}$ ohm·cm by the reduced-pressure vapor-phase synthetic method for film formation. A fluidized-bed pretreatment was undertaken by setting the same with the surface to form a diamond film thereon facing downwardly. The treatment vessel was a tube of vinyl chloride resin having an inner diameter of 8 inches and a height of 1 meter.

The diamond particles taken into the treatment vessel were 700 g of synthetic diamond having a particle diameter of 400 µm and nitrogen gas as a gaseous fluid was upwardly passed from below through a disperser plate. The flow velocity of the nitrogen gas was 366.0 cm/second which was 20 times of the velocity for incipient fluidization 18.3 cm/second. The nitrogen gas was introduced into the treatment vessel after adjustment of the relative humidity to 85% by mixing a nitrogen gas humidified to have a relative humidity of about 100% by passing a stainless steel-made bubbler containing pure water and a dry nitrogen gas in a gas mixer.

The substrate was fixedly held in about the center position of the fluidized bed of diamond particles with the surface for the fluidized-bed pretreatment facing perpendicularly to the flow of the gas. The potential of the substrate, which had been +0.56 kV before the treatment, was from −0.13 to −0.15 kV during the treatment and after the treatment.

Film formation of a diamond film was conducted on the surface of the substrate after the pretreatment in this way by the microwave vapor-phase synthetic method. Firstly, the substrate after completion of the fluidized-bed pretreatment was set inside of the chamber which was evacuated by a rotary pump down to a base pressure of $10^{-3}$ Torr followed by introduction of hydrogen and methane as the starting reactant gases at flow rates of 997 ml/minute and 3 ml/minute, respectively. While keeping the pressure inside of the chamber at 30 Torr by adjusting the aperture of the valve leading to the evacuation system, film formation was conducted for 30 hours by inputting microwaves (2.45 GHz) of 3 kW power. The thus obtained diamond film had a thickness of 3.6 µm, 3.3 µm and 3.8 µm at the positions 10 mm, 30 mm and 50 mm, respectively, apart from the periphery of the substrate and an average film thickness of 3.6 µm with uniformity of ±7%. Further, measurement of the stress of the diamond film was undertaken to find an average value of 130 MPa with uniformity of ±110% within the 35 mm square area in the center part.

EXAMPLE 2

By using a substrate which was the same SiN film-coated Si wafer as in Example 1, the substrate was subjected to a fluidized-bed pretreatment by introducing nitrogen gas for fluidization, which was adjusted to have a relative humidity of 85% by the same method as in Example 1 and further ionized by passing an in-line type ionizing apparatus (Model Ionizer 4210, manufactured by Ion System Inc.) into the treatment vessel.

The potential of the substrate, which had been +0.49 kV before the treatment, was −0.05 to −0.06 kV during the treatment and after 3 hours of the treatment.

Film formation of a diamond film was conducted on this substrate after completion of the fluidized-bed pretreatment by the same method as in Example 1. The thus obtained diamond film had a thickness of 3.7 µm, 3.6 µm and 3.8 µm at the positions 10 mm, 30 mm and 50 mm, respectively, apart from the periphery of the substrate and an average film thickness of 3.7 µm with uniformity of ±2%. The stress of the film was 135 MPa±4%.

Comparative Example

By using a substrate which was the same SiN-film-coated Si wafer as in Example 1, the substrate was subjected to the pretreatment under the same conditions excepting for the omission of humidification of the nitrogen gas for fluidization. The nitrogen gas used here was obtained by evaporation of liquid nitrogen and had a relative humidity of approximately 0%. The potential of the substrate, which had been +0.42 kV before the treatment, was −1.6 to −1.7 kV during the treatment and after the treatment for 3 hours. Due to a large amount of the diamond particles attracted onto the substrate surface in the initial stage of the treatment, impingement of diamond particles to the substrate surface thereafter was disturbed.

Film formation of a diamond film was conducted on this substrate after completion of the fluidized-bed pretreatment under the same conditions as in Example 1. The thus obtained diamond film was not a continuum of the film covering the entire substrate surface but the underlying substrate surface was exposed in about a half of the surface area.

As is understood from the above given Examples and Comparative Example, prevention of electrostatic charging of the substrate surface in accordance with the present invention in the fluidized-bed pretreatment of the substrate results in impingement of diamond particles at the substrate surface uniformly and with a large kinetic energy. As a consequence, a sufficiently high deposition density of diamond can be obtained in the formation of a coating film of diamond by the vapor-phase synthetic method even on the surface of a large substrate having a diameter of 4 inches or larger. Irrespective of the electric conductivity of the substrate, accordingly, it is now possible to obtain diamond films of a 4 to 8 inches diameter and a 0.1 to 30.0 µm thickness having extremely high uniformity of the film thickness distribution and stress distribution within the film to be sufficient for use as a mask membrane for X-ray and electron-beam lithography in a high yield.

What is claimed is:

1. In a method for the pretreatment of a surface of a substrate for the formation of a coating film of diamond deposited on the surface by holding the substrate within a bed of diamond particles fluidized in a fluidization vessel by an upward flow of a fluidization gas introduced into the bottom of the fluidization vessel, the improvement wherein the substrate is kept in the range from +1.5 kilovolts to −1.5 kilovolts by controlling the relative humidity of the fluidization gas so as to be at least 40% during said method.

2. The improvement as claimed in claim 1 in which the fluidization gas is ionized and the electrostatic charges on the substrate surface are neutralized by contacting with the ionized fluidization gas.

3. The improvement as claimed in claim 1 in which the fluidization gas is ionized and the electrostatic charges on the substrate surface are neutralized by contacting with the ionized fluidization gas.

4. The improvement as claimed in claim 1 in which the relative humidity of the fluidization gas is controlled to be 40% or higher by bubbling the gas into a water bath or by spraying water into the flow of said gas.

5. The improvement as claimed in claim 2 in which the relative humidity of the fluidization gas is controlled to be 40% or higher by bubbling the gas into a water bath or by spraying water into the flow of said gas.

6. The improvement as claimed in claim 3 in which the relative humidity of the fluidization gas is controlled to be 40% or higher by bubbling the gas into a water bath or by spraying water into the flow of said gas.

7. The improvement as claimed in claim 1 in which the coating film of diamond formed on the substrate surface serves as a diamond membrane of a lithographic mask.

* * * * *